(12) United States Patent
Thallner et al.

(10) Patent No.: US 12,481,222 B2
(45) Date of Patent: Nov. 25, 2025

(54) METHOD AND DEVICE FOR THE EXPOSURE OF A PHOTOSENSITIVE COATING

(71) Applicant: EV Group E. Thallner GmbH, St. Florian am Inn (AT)

(72) Inventors: Bernhard Thallner, St. Florian am Inn (AT); Boris Povazay, St. Florian am Inn (AT); Tobias Zenger, St. Florian am Inn (AT); Thomas Uhrmann, St. Florian am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 493 days.

(21) Appl. No.: 18/008,739

(22) PCT Filed: Jul. 6, 2020

(86) PCT No.: PCT/EP2020/068996
§ 371 (c)(1),
(2) Date: Dec. 7, 2022

(87) PCT Pub. No.: WO2022/008031
PCT Pub. Date: Jan. 13, 2022

(65) Prior Publication Data
US 2023/0251580 A1  Aug. 10, 2023

(51) Int. Cl.
*G03F 7/00* (2006.01)
*G03F 7/095* (2006.01)

(52) U.S. Cl.
CPC ........ *G03F 7/70466* (2013.01); *G03F 7/0957* (2013.01)

(58) Field of Classification Search
CPC ..... G03F 7/70466; G03F 7/0957; G03F 7/095
See application file for complete search history.

(56) References Cited

U.S. PATENT DOCUMENTS

| 5,422,205 A * | 6/1995 | Inoue ................. G03F 1/70 430/311 |
| 5,742,067 A | 4/1998 | Imai |
| 6,238,852 B1 | 5/2001 | Klosner |
| 7,229,723 B2 * | 6/2007 | Rau ................... G03F 7/095 430/394 |
| 7,989,154 B2 | 8/2011 | Jeon et al. |
| 9,104,122 B2 | 8/2015 | Lorusso et al. |
| 10,514,611 B2 | 12/2019 | Patra |
| 10,678,144 B2 | 6/2020 | Patra |
| 10,852,528 B2 | 12/2020 | Thallner et al. |

(Continued)

FOREIGN PATENT DOCUMENTS

| DE | 10 2016 217 929 A1 | 3/2018 |
| JP | H08-227854 A | 9/1996 |

(Continued)

OTHER PUBLICATIONS

Office Action issued in related Japanese Patent Application No. 2022-576896 dated May 21, 2024.

(Continued)

*Primary Examiner* — Stewart A Fraser
(74) *Attorney, Agent, or Firm* — RENNER, OTTO, BOISSELLE & SKLAR, LLP

(57) ABSTRACT

The invention relates to a method and a device for the exposure of a photosensitive coating.

17 Claims, 2 Drawing Sheets

(56) References Cited

U.S. PATENT DOCUMENTS

| | | |
|---|---|---|
| 11,460,777 B2 | 10/2022 | Thallner et al. |
| 2002/0021426 A1 | 2/2002 | Mei et al. |
| 2002/0122918 A1 | 9/2002 | Dentinger et al. |
| 2005/0202352 A1* | 9/2005 | Cyganski ............... G03F 7/031 430/394 |
| 2006/0134559 A1* | 6/2006 | Ha ...................... G03F 7/2022 430/394 |
| 2008/0182081 A1 | 7/2008 | Jeon et al. |
| 2009/0133922 A1 | 5/2009 | Okazaki et al. |
| 2013/0083302 A1* | 4/2013 | Wu ................... G03F 7/70575 355/27 |
| 2015/0185617 A1* | 7/2015 | Markle ............... G03F 7/70383 430/269 |
| 2019/0204756 A1 | 7/2019 | Patra |
| 2019/0287795 A1 | 9/2019 | deVilliers et al. |
| 2019/0293924 A1 | 9/2019 | Thallner et al. |
| 2020/0089121 A1 | 3/2020 | Thallner et al. |
| 2020/0090963 A1 | 3/2020 | Bubendorfer et al. |
| 2020/0096877 A1 | 3/2020 | Patra |
| 2021/0247697 A1 | 8/2021 | Thallner et al. |

FOREIGN PATENT DOCUMENTS

| | | |
|---|---|---|
| JP | H11-320963 A | 11/1999 |
| JP | 2001-330963 A | 11/2001 |
| JP | 2003-174118 A | 6/2003 |
| JP | 2004-042143 A | 2/2004 |
| JP | 2007-079315 A | 3/2007 |
| JP | 2008-535019 A | 8/2008 |
| JP | 2008-216799 A | 9/2008 |
| JP | 2011-128295 A | 6/2011 |
| JP | 2012033925 | 2/2012 |
| JP | 2012-208350 A | 10/2012 |
| JP | 2014-106302 A | 6/2014 |
| JP | 2014-190987 A | 10/2014 |
| JP | 2019530024 A | 10/2019 |
| JP | 2020-502577 A | 1/2020 |
| JP | 2020-510242 A | 4/2020 |
| JP | 2020-197693 A | 12/2020 |
| TW | 201234121 A | 8/2012 |
| TW | 201802604 A | 1/2018 |
| WO | WO-2006/088059 A1 | 8/2006 |
| WO | WO-2018/113917 A1 | 6/2018 |
| WO | WO-2018/113918 A1 | 6/2018 |
| WO | WO-2019/242840 A1 | 12/2019 |

OTHER PUBLICATIONS

Taiwanese Office Action with Search Report issued in related Taiwan Patent Application No. 110121104 dated Feb. 10, 2025.
International Search Report from corresponding International Patent Application No. PCT/EP2020/068996, dated Apr. 1, 2021 with English-language translation.
Written Opinion from corresponding International Patent Application No. PCT/EP2020/068996, dated Apr. 1, 2021.
Last Notification of Grounds for Rejection issued in related Japanese Patent Application No. 2022-576896 dated Nov. 7, 2024.
Notification of Grounds for Rejection issued in related Japanese Patent Application No. 2022-576896 dated Apr. 18, 2025.
Rejection Decision issued in related Japanese Patent Application No. 2022-576896 issued Aug. 19, 2025, with English translation.

* cited by examiner

METHOD AND DEVICE FOR THE EXPOSURE OF A PHOTOSENSITIVE COATING

FIELD OF THE INVENTION

The present invention relates to a method and a device for the exposure of a photosensitive coating.

BACKGROUND OF THE INVENTION

Photolithography is one of the most important methods in the semiconductor industry for structuring a material. Photolithography is primarily carried out with the aid of masks in the prior art.

Mask production, however, is also the major problem of mask-based photolithography. A mask has to be produced by very expensive and time-consuming production processes. Recourse is therefore taken to electron beam lithography. Furthermore, a plurality of masks have to be produced for the production of complex functional components. It is not unusual for the cost for the production of all the masks for only one microchip to lie in the million euro range.

In the prior art, therefore, an alternative method has been developed in the past few years, in which a substrate is not exposed over the whole area, but only in sections with the aid of digitally controlled scanning, e.g. of a switchable field of mirrors. The mirrors of the mirror field, a so-called digital micromirror device, DMD, can be programmed individually, in particular very frequently, and can thus permit the punctual, arbitrarily approachable structured exposure of a section to be exposed. At the same time, a relative movement between the substrate and the optical system to which the DMD belongs is carried out, which permits an exposure of the entire substrate surface. The prior art is known from WO 2018113917A1, 2018113918A1, 2019242840A1.

Through the use of a DMD, a photolithographic layer with a pattern, a so-called layout, can be exposed. At each point at which the layer is bombarded with the photons of a well-defined wavelength, an indirect or direct chemical reaction of the photolithographic layer takes place. Further process steps, in particular the development step, lead to a solidification of the so-called layout.

In the disclosure, mention is always made of a DMD as an illustrative example. Instead of the DMD, however, general, in particular transmissive, structured elements can also be used. Transmissive optical elements are important chiefly for steppers. They differ from a DMD in that spatially resolved structuring is brought about not by mirrors, but by, in particular switchable, apertures. The precise embodiment of such an element will not be dealt with in greater detail in this publication.

Instead, a DMD is described as an illustrative optical element for the programmable, spatially resolved exposure.

With the aid of the aforementioned methods, it is already possible today to produce the most diverse 2D structures, i.e. structures inside a plane, or in a single layer which varies in height, e.g. as the uppermost layer on a structure with different topography (2.5D).

Primarily, the structure of 2.5D or 3D structures with complex geometry changing in the beam direction, in particular roofed concave cavities, cannot be produced in a single exposure process using devices and methods of the prior art.

It is very likely possible to produce 2.5D and 3D structures by repeated use of the known methods. Thus, it would be possible to apply a first layer on a substrate, to expose and then to develop the latter after positioning of the image, wherein the substrate is chemically solidified or dissolved depending on the exposure and polarity of the lacquer, and to coat the substrate again with a further layer and to expose and develop the latter again. The steps can be repeated as often as desired, for a corresponding number of desired layers and therefore stacked layouts.

It is obvious that all the aforementioned process steps have to be carried out for the development of each layer, which leads to a very great outlay and therefore to high costs. Furthermore, the probability of errors for each possible type of error increases with each additional process step. In particular, the correct lateral position during the exposure is an error-sensitive step, which can lead to an accumulated loss of quality.

The aim of the present invention, therefore, is to eliminate or significantly reduce the drawbacks of the prior art. In particular, it aims to carry out the exposure in a quicker and easier way and to reduce the errors of all kinds.

SUMMARY OF THE INVENTION

The problem is solved with the subject-matter of the coordinated claims. Advantageous developments of the invention are given in the sub-claims. All combinations of at least two features given in the description, in the claims and/or the drawings also fall within the scope of the invention. In stated value ranges, values lying inside the stated limits are also deemed to be disclosed as limiting values and can be claimed in any combination.

The invention relates to a method for the exposure of a photosensitive coating, comprising at least a first photosensitive area and a second photosensitive area, wherein the first area reacts to photons of a first wavelength and the second area, in particular overlapping the first area, reacts to photons of a second wavelength, wherein the first wavelength is different from the second wavelength, wherein the method comprises the following steps, in particular in the following sequence:
exposure of the coating to the photons of the first wavelength,
exposure of the coating to the photons of the second wavelength.

In the following text, the photosensitive areas are referred to merely as areas.

The invention further relates to a device for the exposure of a photosensitive coating, comprising at least a first photosensitive area and a second photosensitive area, wherein the first photosensitive area reacts to photons of a first wavelength and the second photosensitive area reacts to photons of a second wavelength, wherein the first wavelength is different from the second wavelength, comprising a radiation device for the exposure of the coating to the photons of the first wavelength and for the exposure of the coating to the photons of the second wavelength.

The invention further relates to an article, produced with the method according to the invention and/or the device according to the invention.

The essence of the invention includes in particular the fact that individual focusing of the photons on the individual photosensitive area is not necessary, since both areas have been deposited typically in thin layers lying very close to one another, within the depth of definition of the projection. The photons of the respective wavelength can advantageously radiate through the photosensitive coating, but only produce a photochemical reaction in the area in which the material reacts to the photons of the corresponding wavelength.

Provision is preferably made such that the coating is exposed by means of a dynamically controllable unit, in particular by means of a digital micromirror device, or that the device comprises a dynamically controllable unit, in particular a digital micromirror unit, for the exposure of the coating.

Furthermore, provision is preferably made such that the coating is exposed by means of at least one mask or that the device comprises at least one mask for the exposure of the coating.

Furthermore, provision is preferably made such that the exposure of the coating to the photons of the first wavelength produces a photochemical reaction only in the first area and the exposure of the coating to the photons of the second wavelength produces a photochemical reaction only in the second area.

Furthermore, provision is preferably made such that the coating is exposed or can be exposed in a spatially resolved and/or punctual manner, particularly by means of beam bundles.

Furthermore, provision is preferably made such that the coating is exposed by an individually controllable photon source, wherein the wavelength and/or the dose of the photons is/are or can be adjusted.

Furthermore, provision is preferably made such that the coating is exposed by positioning a filter in front of a broad-band photon source, wherein the wavelength and/or the dose of the photons is/are or can be adjusted.

Furthermore, provision is preferably made such that different depth regions of the coating react after one another.

Furthermore, provision is preferably made such that the coating has sensitivities for photons of the same wavelength which vary over a thickness of the coating.

Furthermore, provision is preferably made such that the coating is a single layer. The different areas are different layer locations, which have photosensitivities of differing strength for different or identical wavelengths of differing strength. It is also conceivable that the different layer locations to not react in a wavelength sensitive manner, but sensitive to the intensity of the radiation, i.e. the intensity.

However, provision is still more preferably made such that the first area is constituted as a first layer and the second area is constituted as a second layer on the first layer. Any number of further layers can of course be applied, which form an arbitrary number of further areas, which are processed in common preferably in a common exposure and development step.

Furthermore, provision is preferably made such that the coating is moved/can be moved with respect to the radiation device. In particular, a mobile support is provided for moving the coating with respect to the radiation device. The coating can be located on a substrate, wherein the substrate is in turn located on a substrate holder. The substrate holder is preferably constituted mobile for the movement of the substrate with the coating with respect to the radiation device.

The invention describes in particular a method and a device for the, in particular maskless, 2.5D or 3D exposure of the coating or a layer system, comprising at least two photosensitive layers lying one above the other at different depths. This 2.5D or 3D exposure is also referred to in the subsequent text as a spatial exposure, in order to distinguish it from 2D, i.e. an exposure in a plane. In particular, a spatial exposure is understood to mean an exposure in which 2.5D or 3D structures can be produced directly in a single exposure process. An exposure process is understood to mean the number of all the process steps between loading of the substrate onto and removal of the substrate off the device.

The device according to the invention and the method according to the invention have a number of advantages compared to the prior art.

One advantage with respect to the prior art includes the possibility of carrying out the spatial exposure at a very high speed and at the same time with high precision on account of the absence of numerous adjustment and intermediate processing steps. In particular, a multiple exposure with individual masks, which would have to be aligned for each exposure step, and a multiple exposure and multiple development can be dispensed with. As a result of this advantage according to the invention, an increase in the throughput in particular results.

A further advantage includes the fact that the accuracy of the layout increases considerably in the individual layers, since the alignment error is absent which arises on account of mask alignment when a plurality of individual exposures are carried out.

A further advantage includes the fact that the structuring depth is increased via the depth of definition and chemical behaviour of the lacquer. Structuring depth is understood to mean the region of the coating in which the chemical reaction due to photon bombardment takes place.

In the prior art, the optical elements for the exposure have to be designed such that the photons which are used for the exposure are focused in a focal plane, or that in the shadow-casting principle positioning of the photosensitive area takes place in the near field of the mask.

According to the invention, focusing of the light on the individual photosensitive area is advantageously not necessary, or takes place simultaneously in the context of the depth of definition of the projection, or can take place by a spacing of the wavelength-dependent focal planes, said spacing being fixed in the device. The photons of each wavelength can advantageously radiate through the photosensitive coating, but produce a photochemical reaction only in the area in which the material reacts to the photons of the corresponding wavelength.

A further advantage includes producing overhanging structures on account of the support material which can be removed in a single work step. Support material is understood to mean the material which is located between an overhanging structure, in particular a cover to be formed, and the substrate.

A further advantage includes the fact that a highly accurate vertical structuring possibility, i.e. in the direction of the thickness of the coating, is produced. Whereas methods and devices in the prior art have to adjust and control the focusing of the photons in a focal plane, a direct penetration of the coating with the radiation can take place according to the invention in a spatially resolved, punctual manner, in particular by means of beam bundles. Particular attention does not have to be paid either to the depth of definition or to the focal plane.

Furthermore, with the aid of the invention, the height of the spatial structures can advantageously be controlled more precisely than for example with greyscale lithography, wherein the exposure is controlled depth-dependent via the radiation dose. This permits the production of higher free-standing roof structures which are more true to shape, in particular of membranes with large cavities lying beneath.

A further advantage includes the increased lateral resolution, since previous process steps are no longer carried out. Since there is now only one continuous exposure process, the exposure can no longer be negatively influenced by scattering and/or reflection centres of previous erected structures.

A further advantage includes the possibility of adjusting the wavelength and/or the dose in a targeted manner very easily by individually controllable photon source and/or adjustment of a filter in front of a broadband photon source. The method according to the invention can thus be implemented very easily by the device according to the invention.

A further advantage includes the fact that different structures of each area can in each case be written by the photons of one wavelength, but can also be structured differently in a selective manner by multiple exposure.

A further advantage for the device according to the invention with DMD primarily includes the fact that the baking-out and developments steps for each individual layer are replaced by a single baking-out and development step at the end of the exposure. In a coating with n areas with n>1, n−1 baking-out and developments steps are thus saved, which leads to an enormous increase in throughput of the process.

Photosensitive Coating

The embodiments according to the invention are based in particular on the fact that, with the aid of a polychromatic photon source, layouts to be exposed lying above one another are exposed simultaneously and above all not cumulatively.

In particular, the n layouts lying above one another can be exposed in such a way that the i-th layer in the i-th area of the coating is exposed by the mirrors of the i+j*n-th row of the DMD, wherein it is the case that $0<=j<=m$, with $m=N/n$ and N is the number of the DMD mirror rows.

In particular, it is also possible to expose layouts lying above one another, in that a switchover takes place timewise between the layouts. The DMD thus projects at least two layouts per unit of time, more precisely partial sections of the layout, onto the coating.

To be able to carry out such an exposure, a photosensitive coating is in particular provided, wherein photons with different wavelengths expose different depth regions, without acting on the adjacent depth regions.

In a first embodiment according to the invention, the coating includes a single layer. This layer comprises, in particular over the depth, changing physical and/or chemical properties, in particular a different sensitivity to photons of a certain wavelength. In a first embodiment, the transfer between the different physical and/or chemical properties as a function of the depth can be described mathematically by a step function.

Alternatively, the chemical and/or physical properties change continuously as a function of the depth. In this case, the chemical and/or physical properties can be described by a constantly differentiable function. For the purpose of a simplification, all such changes of the chemical and/or physical properties as a function of the depth are referred to as gradients.

In particular, it may also be the case that the chemical and physical properties of the coating are homogeneous and the spatially changing photosensitivity is determined by the absorption, which is wavelength-dependent and thickness-dependent. The intensity of a photon flow of photons of a certain wavelength continuously diminishes as a function of the penetration depth. As a result of the reduction of the intensity, the photosensitivity thus also changes. The depth selectivity is thus achieved by a saturation mechanism—bleaching-out. The radiation leads on the one hand to the exposure, on the other hand the exposed area thus becomes transparent. A front thus arises, as a result of which the radiation "eats away", so that a 2.5-dimensional terrain can be produced.

In a second embodiment according to the invention, the exposure includes a plurality, i.e. at least two, layers. This embodiment is particularly advantageous, since, by means of coating processes, in particular by means of centrifugal coating processes, it is particularly straightforward to produce a plurality of layers, whereof each individual one has a well-defined physical and/or chemical property with respect to photons of a specific wavelength. With the material selection, in particular, recourse can already be taken to different materials from different manufacturers, which have precisely the chemical and/or physical properties that are required in order to be able to carry out the method according to the invention.

In a third embodiment according to the invention, the exposure can be a combination of the first two embodiments. It would therefore be conceivable for the coating to include a plurality of layers and for at least one of the layers itself to have a gradient according to the first embodiment.

In a second particular embodiment according to the invention, solvents and/or photoinitiators of different layers do not react across layer boundaries. Such an unfavourable reaction can be reduced to a minimum, by the fact that the exposure according to the invention takes place as quickly as possible after the application of the coating.

In a particular form according to the invention, a stop layer is introduced between the photosensitive locations, which interrupts the propagation of the so-called "chemically reinforced" photoreaction between the layers. This can also be used to achieve a stepped, radiation dose-dependent exposure with a single wavelength.

In a special embodiment according to the invention, a cross-sensitivity of the photosensitivity in the layers is created with differing strength. Cross-sensitivity is understood to mean the photosensitivity of the coating normal to the irradiation direction. The higher the cross-sensitivity, the less sharp a point of the coating can be exposed and/or developed. It is conceivable for example that a parallel incident beam of photons exposes a first layer more intensely in the lateral, i.e. horizontal, direction than a second layer.

The photosensitive coating can be produced from any kind of photosensitive material, but lacquers, in particular photo-lacquers, are preferably used.

In a very particularly preferred embodiment, at least one of the following materials is used.

TOK PMER P-LA900PM
TOK CR4000
AZ nLOF2000 series
Allresist Atlas 46
Allresist Atlas 46R
JSR IX335H
JSR WPR5100
JSR THB Device The device according to the invention is preferably a maskless exposure unit with at least one micromirror device (DMD), which has been extended by a polychromatic photon source.

In a very special embodiment according to the invention, the device according to the invention comprises a plurality of DMDs, which can thus expose a plurality of positions of a coating simultaneously. In particular, a single DMD can be used for each wavelength, or the DMD can be split up into areas exposed with different wavelengths. The disclosure content can then be applied individually to each DMD correspondingly.

An alternative device according to the invention is a mask-based exposure unit, which has been extended with the corresponding polychromatic photon source. The application of the method according to the invention is thus also possible for mask-based exposure units.

All the devices according to the invention in particular comprise at least one polychromatic photon source. The photon source is a part of an optical system generally including very many optical elements. The optical system is described in greater detail in the following text.

Photon Source

A photon source is understood in the subsequent text to mean a component or a group of components, which is/are capable of emitting photons with at least one specific wavelength. In special embodiments, a single photon source can be polychromatic.

In a first embodiment according to the invention, the photon source is a device which emits photons with a polychromatic spectrum, in particular the mercury lamp. The mercury lamp has a polychromatic spectrum in the UV region. Filters could for example be provided in the photon source, which only allow photons of a required wavelength to pass through. By switching the filters, a switch can be made between the different wavelengths.

In a second embodiment according to the invention, the photon source is a number of individual, monochromatic photon sources.

In a special embodiment of the second embodiment according to the invention, each of the individual monochromatic photon sources is a light-emitting diode (LED) or a light-emitting diode field (eng.: LED array). Since each LED or each LED array can always emit only monochromatic radiation, a plurality of corresponding components with different wavelengths have to be used. As a result of the possibility of being able to switch, in particular electronically, the different LEDs or LED arrays, the use of, in particular mechanical, filters can advantageously be dispensed with.

For the sake of completeness, however, the possibility of also being able to electronically switch single monochromatic photon sources independently, as well as sources which are wavelength-variable by other mechanisms, is also referred to as "filters". Thus, when mention is made in the text of the filtering of such a single, monochromatic photon source, this is understood to mean that this one, and only this one, monochromatic photon source emits photons, whereas all the other monochromatic photon sources do not emit any photons.

In an illustrative structure, the aforementioned monochromatic photon sources are implemented as polychromatic photon sources with a different spectral distribution and are referred to as monochromatic, or as a different wavelength solely for the purpose of simplification.

Optical Systems

The optical system of the device according to the invention is a number of optical and/or mechanical and/or electrical elements. The optical system comprises at least one photon source.

Further elements can be
DMD
Mirrors
Lenses
Prisms
Apertures
Masks

At least one optical element is preferably also located in the secondary path, i.e. in the optical path, between the DMD and the coating.

Still more preferably, the optical elements are imaging optical elements.

In a very preferred embodiment according to the invention, the optical elements are ones which are capable of imaging the active structure of the DMD through a mathematical, in particular affine, transformation onto an image in the coating. Shearing and scaling transformations in particular are preferred. Such an optical system has already been mentioned in publication WO2018113918A1.

Relative Movement

The device according to the invention is preferably designed such that a substrate holder, on which a substrate is arranged which is coated with the photosensitive coating, can actively move, whereas the optical system is static. Alternatively, it is possible to design the device such that the optical system moves whereas the substrate holder is static or that the optical system and/or the substrate holder can move, or a deflection arrangement takes place for the lateral movement. In the case of small exposure areas, or large exposure elements, the lateral movement can also be dispensed with.

It is therefore preferable that a relative movement between the substrate holder and the optical system is enabled.

As a result of the fixing of the substrate on the substrate holder, a precise relative movement between the substrate and the optical system is enabled.

Method

The method according to the invention in particular permits the formation of cavities by means of the structuring of side walls and roofs in the MEMS and microfluidic area in a single exposure step.

The method according to the invention in particular permits the simultaneous exposure of redistribution layers and through-contacting, such as is used in advanced packaging.

The method according to the invention can advantageously be used for
maskless exposure units, in particular maskless laser exposure units,
other maskless systems, especially including laser scanners,
mask-based exposure units, in particular mask aligners, in particular steppers and scanners with exchangeable or displaceable masks.

In a particular embodiment, the method according to the invention can also be used for mask-based exposure units.

The method according to the invention is preferably used for maskless exposure units, in particular for maskless laser exposure units. The preferred method according to the invention according to a first embodiment is described in greater detail below.

In a first process step of the method according to the invention, a substrate is coated with at least a first photosensitive layer. For this purpose, the substrate is preferably loaded into a coating device specifically provided for coatings and is coated there.

The coating preferably takes place with the aid of centrifugal coating. If the photosensitive coating is a coating of the first embodiment, i.e. a coating which has a single layer, the following second process step of the coating of further layers can be skipped.

A pre-requisite for this is that the single coating has at least two areas, so that the different layouts to be exposed can be sufficiently resolved.

In a second process step of the first method according to the invention, the substrate is coated with at least a second photosensitive layer. The coating of the second photosensitive layer preferably takes place in the same coating device. The coating device is thus preferably provided with at least two complete coating means, in particular tubes or nozzles, in order to prevent mixing of the lacquer of differing sensitivity. According to the invention, the method is not restricted to this second photosensitive layer. If the device according to the invention comprises a photon source which can emit the photons with n wavelengths separable from one another optically, it may also be sensible according to the invention to produce n photosensitive layers above one another which can be exposed independently of one another. The method according to the invention is described below chiefly on the basis of two layers. The extension to n layers applies analogously.

In a special embodiment according to the invention, the second process step is not necessary, insofar as the wavelength sensitivity of the first deposited layer changes as a function of the location in the thickness direction.

In a third process step of the first method according to the invention, the coated substrate is loaded into a device according to the invention and a relative movement between the substrate and the optical system to a first position takes place.

In a fourth process step of the first method according to the invention, the mirrors of the DMD is switched into a first configuration in the first position. In particular to speed up the process, the switching of the mirrors of the DMD into the first configuration can already have taken place during the relative movement according to the third process step.

In a fifth process step of the first method according to the invention, the mirrors of the DMD, which are located in the first configuration, are irradiated in the first position by the photon source with the photons of a first wavelength. The first layout to be produced with the DMD is projected into the first photosensitive area. An adjustment of a focal point is advantageously not required.

The photons with the first wavelength advantageously radiate through all the areas present. Since, according to the invention, only some, in particular only one, of the areas of the coating are, however, photosensitive for the photons of the first wavelength, only some, in particular only one, of the areas of the coating are changed photochemically.

In a sixth process step of the first method according to the invention, the mirrors of the DMD are switched into a second configuration in the first position.

In a seven process step of the first method according to the invention, the mirrors of the DMD, which are located on the second configuration, are irradiated in the first position by the photon source with the photons of a second wavelength. The second layout to be produced by the DMD is projected into a second area.

Advantageously, an adjustment of the focal point into the second area is not necessary. The photons with the second wavelength radiate through all the areas present. Since, however, only some areas, in particular only one area, is/are photosensitive for the photons of the second wavelength, only some areas, in particular only one area, are changed photochemically.

If there are more than two photosensitive areas, process steps six to seven have to be correspondingly repeated with other configurations for the mirrors of the DMDs and with different wavelengths.

In an eighth process step of the first method according to the invention, the relative movement between the substrate and the optical system takes place to a second position.

Process steps four to eight are repeated until such time as the entire area to be processed has been exposed.

In a ninth process step of the first method according to the invention, the unloading of the substrate and the development of the coating on the substrate take place. The development advantageously has to be carried out only once.

The aforementioned process steps do not necessarily all have to take place in this sequence. Some of the aforementioned process steps are advantageously carried out simultaneously. In particular, the relative movement, the exposure and the switching of the DMD take place simultaneously or at least so fast that it is no longer necessary or possible to consider the process steps as being separate from one another.

In particular, this simultaneity leads to a correspondingly high throughput and to a high level of efficiency. The transfer between some of the process steps is at least seamless.

Apart from the possibility of using the method according to the invention for a maskless exposure unit with a DMD, the method according to a second embodiment can also be used for mask exposure units.

The first three process steps of the second method according to the invention are identical to the first three process steps of the first method according to the invention.

In a fourth process step of the second method according to the invention, the substrate is aligned relative to a first mask in a mask exposure unit. The substrate is preferably brought into an end position and fixed. The first mask then moves relative to the substrate. The alignment takes place preferably on the basis of alignment marks between the first mask and the substrate.

In a fifth process step of the second method according to the invention, the full-area exposure of the coating takes place through the first mask with the photons of the first wavelength.

In a sixth process step of the second method according to the invention, the first mask is replaced by a second mask.

In a seventh process step of the second method according to the invention, the substrate is aligned relative to the second mask in the mask exposure unit. The substrate preferably remains in its fixed end position. The second mask then preferably moves relative to the substrate. The alignment preferably takes place on the basis of alignment marks between the second mask and the substrate.

In an eighth process step of the second method according to the invention, the full-area exposure of the coating takes place through the second mask with the photons of the second wavelength.

Process steps six to eight can be repeated for other masks and wavelengths, insofar as the coating is designed for other exposures.

In a ninth process step of the second method according to the invention, the unloading of the substrate takes place.

In a tenth process step of the second method according to the invention, the development of the coating on the substrate takes place. The development advantageously has to be carried out only once.

BRIEF DESCRIPTION OF THE DRAWINGS

Further advantages, features and details of the invention emerge from the following description of preferred examples of embodiment and with the aid of the drawings. In the figures.

DETAILED DESCRIPTION OF THE INVENTION

Identical components and components having the same function are denoted with the same reference numbers in the figures.

The figures are not true to scale. In particular, photosensitive layers $3a$, $3b$ and optical system 4 with all its elements are not represented true to scale compared to substrate 1.

The inventive principle is illustrated by way of example in the simplest and most efficient way, in that each area is represented as a single, deposited layer. In the following FIGS. 1a-1f, the method according to the invention is thus described on the basis of a coating 3, which includes two photosensitive layers $3a$ and $3b$, which represent the areas which react with differing intensity to the photons of different wavelengths. The person skilled in the art recognises that the two layers $3a$ and $3b$ can also be regarded more generally as areas, which for example are part of a single layer, which would then be equivalent to the coating. In this case, the application of two layers in FIGS. 1a-1b would have to be thought of as being replaced by the application of a single layer.

Figure 1A:
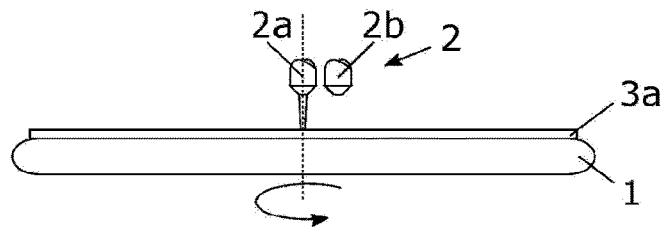
FIG. 1a shows a first process step of a first method according to the invention.

FIG. 1a shows a first process step of a first method according to the invention, wherein a substrate 1 is coated, by means of a first single coating element $2a$ of a coating system 2, preferably a tube or a nozzle, with a first photosensitive layer $3a$. Photosensitive layer $3a$ thus corresponds here to a first area of the coating. The coating preferably takes place by means of a centrifugal coating unit. Photosensitive layer $3a$ is then distributed over the substrate surface of substrate 1, as represented in FIG. 1, by a rotation of substrate 1 about an axis of its centre. Any other kind of coating process can be used in order to apply photosensitive layer $3a$ on substrate 1. Photosensitive layer $3a$ is sensitive for a first type of photon with a first wavelength.

Figure 1B:
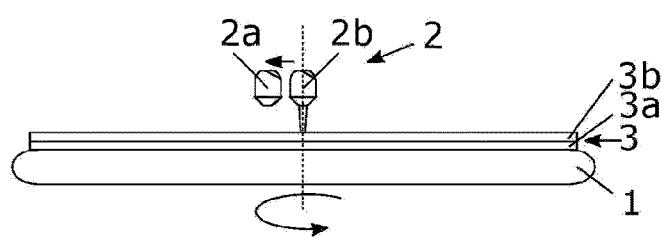
FIG. 1b shows a second process step of the first method according to the invention.

FIG. 1b shows a second process step of the first method according to the invention, wherein a substrate 1 is coated, by means of a second single coating element $2a$ of a coating system 2, preferably a tube or a nozzle, with a second photosensitive layer $3b$. Photosensitive layer $3b$ thus corresponds here to a second area of the coating. The coating preferably takes place by means of a centrifugal coating unit. Photosensitive layer $3b$ is then distributed over the surface of first photosensitive layer $3a$, as represented in FIG. 1b, by a rotation of substrate 1 about an axis of its centre. Any other kind of coating process can be used in order to apply photosensitive layer $3b$ on the surface of photosensitive layer $3a$. Photosensitive layer $3b$ is sensitive for a second type of photon with a second wavelength. The two photosensitive layers $3a$ and $3b$ form a coating 3. It is conceivable to add further photosensitive layers to coating 3. However, in order to keep the figures as simple as possible, the method according to the invention is described only on the basis of a layer system 3 with two photosensitive layers $3a$, $3b$.

Since photosensitive layers $3a$, $3b$ have other physical and/or chemical properties, in particular with regard to their sensitivity to the wavelength of incident photons, it is particularly advantageous for the materials, from which photosensitive layers $3a$, $3b$ are made, to be deposited by two single coating elements $2a$, $2b$ separated from one another. It is also conceivable that coating system 2 comprises only a single coating element.

Figure 1C:
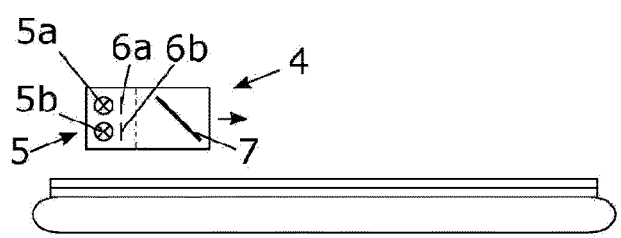
FIG. 1c shows a third process step of the first method according to the invention.

FIG. 1c shows a third process step of the first method according to the invention, wherein substrate 1 is positioned beneath an optical system 4 at a first position. The relative movement between substrate 1 and optical system 4 is represented in the further figures such that substrate 1 moves relative to optical system 4 regarded as static. Optical system 4 in particular comprises a photon source 5, including at least two single photon sources $5a$, $5b$. Single photon sources $5a$, $5b$ are the graphic representation for the origins of photons with different wavelengths. Single photon sources $5a$, $5b$ do not necessarily have to be two different components or groups of components. It would be conceivable, for example, for photon source 5 to be a mercury radiation source. Since mercury can emit photons with different wavelengths, a mercury radiation source would also include a plurality of, in particular at least two, single photon sources $5a$, $5b$. Photon source 5 according to the invention or optical system 6 comprise filters $6a$, $6b$, with the aid of which it can be decided which photons of which single photon sources $5a$, $5b$ are used for the exposure. The filters are not necessarily to be interpreted as independent components or groups of components. When use is made of single photon sources $5a$, $5b$, which are constituted by LEDs or LED arrays, no mechanical, electrical or optical filters are required, since the switching-on or switching-off of the LEDs can directly control the photon flow of a corresponding single proton source $5a$, $5b$. In this connection, filtering of the photons of a single photon source $5a$, $5b$ is understood to mean the switching-off of photon sources $5a$, $5b$. Filters $6a$, $6b$ are preferably constituted as independent components or groups of components and switched electronically and/or optically and/or mechanically, when underlying photon source 5 comprises at least one single photon source $5a$, $5b$, which cannot be switched or cannot be switched quickly enough, or which is itself polychromatic. Photon source 5, which includes a mercury radiation source, must therefore comprise filters $6a$, $6b$, in order to be able to exactly separate from one another two emission lines of the polychromatic mercury spectrum.

In the next two figures the principal of the exposure is described in a more illustrative manner with the aid of layouts $10a$, $10b$. Either positive and/or negative lacquer can be used for individual photosensitive layers $5a$, $5b$. The examples are described on the basis of negative lacquers, i.e. the materials of photosensitive layers $3a$, $3b$, which are hit by photons, crosslink at these points and remain in place after corresponding baking-out and/or development steps. These points are represented as black areas.

Figure 1D:
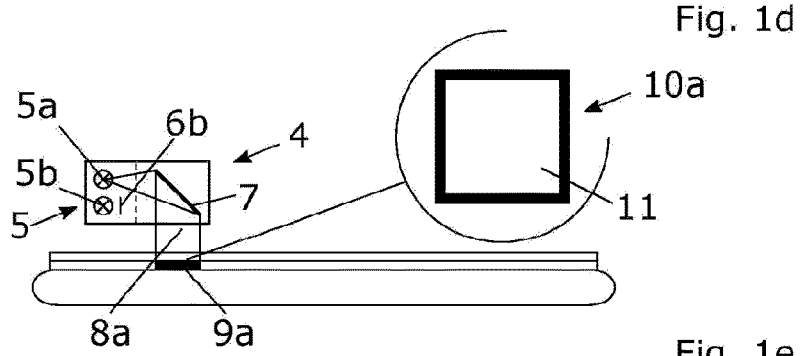
FIG. 1d shows a fourth and fifth process step of the first method according to the invention.

FIG. 1d shows a fourth and fifth process step of the first method according to the invention, wherein the mirrors of DMD 7 are switched into a first configuration. Furthermore, filter 6a is opened and filter 6b is closed. Only the photons of a first wavelength of first, single photon source 5a can be projected onto DMD 7. DMD 7 then carried out a spatially resolved filtering of the photon flow by means of its individual mirrors and projects desired layout section 10a as secondary beam 8a into coating 3. A chemical or physical reaction of the photons with the molecules thus occurs exclusively in first photosensitive layer 3, i.e. only inside depth region 9a, due to the wavelength of the first type of proton. In contrast with the prior art, no focusing of the photon flow onto first depth region 9a of first photosensitive layer 3a has to be carried out with the method according to the invention. The photons of the first wavelength penetrate second photosensitive 3b, without producing a chemical and/or physical reaction there, which leads to an exposure of second depth region 9b.

The enlarged representation shows a layout section 10a projected by DMD 7 into photosensitive layer 3a. The individual mirrors of DMD 7 have been switched in such a way that only the peripheral, i.e. the lateral mirrors of the DMD, have exposed the photons into photosensitive layer 3a. An edge-shaped area, which is later to form the walls of a cavity 11, has thus been exposed.

Figure 1E:
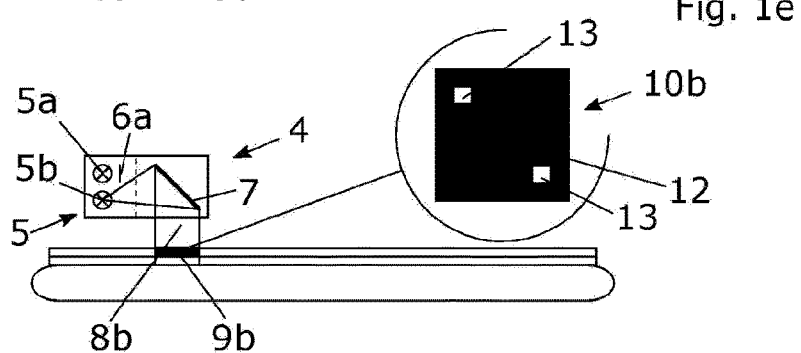
FIG. 1e shows a sixth and seventh process step of the first method according to the invention.

FIG. 1e shows a sixth and seventh process step of the first method according to the invention, wherein the mirrors of DMD 7 are switched into a second configuration. Furthermore, filter 6b is opened and filter 6a is closed. Only the photons of a second wavelength of second, single photon source 5b can be projected onto DMD 7. DMD 7 then carries out a spatially resolved filtering of the photon flow by means of its individual mirrors and projects desired layout section 10b, which differs in general from the layout section from FIG. 4, as secondary beam 8b into coating 3. A chemical or physical reaction of the photons with the molecules thus occurs exclusively in second photosensitive layer 3b, i.e. only inside depth region 9b, due to the wavelength of the first type of proton.

In contrast with the prior art, no focusing of the photon flow onto second depth region 9b of second photosensitive layer 3b has to be carried out with the method according to the invention. The photons of the second wavelength generally also reach first photosensitive 3a, without producing a chemical and/or physical reaction there, which leads to an exposure of second depth region 9a.

The enlarged representation shows a layout section 10b projected by DMD 7 into photosensitive layer 3b. The individual mirrors of DMD 7 have been switched in such a way that almost all the mirrors have projected the photons with a second wavelength into photosensitive layer 3b. Only some mirrors, with which the exposure can be carried out in the upper left-hand and lower right-hand area, have been switched in such a way that the photons have not been projected into photosensitive layer 3b. Areas according to the invention were thus able to be created, which after the subsequent baking-out and/or development steps will form entrances in a cover 12 in order to connect the outside world with cavity 11 (see previous figure).

Figure 1F:
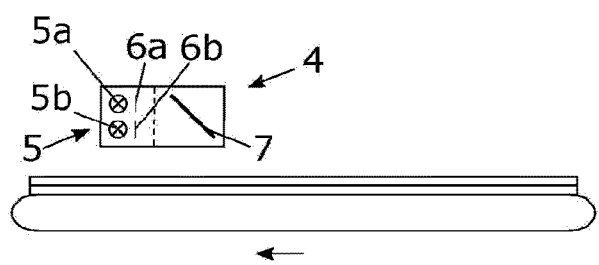
FIG. 1f shows an eighth process step of the first method according to the invention.

FIG. 1f shows an eighth process step of the first method according to the invention, wherein a relative movement between substrate 1 and optical system 4 to a second position takes place. The process steps from FIGS. 1d-1f can be repeated for an arbitrary number of positions.

After these process steps, further process steps take place, in particular the development of coating system 3. Advantageously, only a single development step is required.

The impression could arise from the FIGURES that the method according to the invention is a step-and-repeat process, with the aid of which at least one three-dimensional structure, including cavity 11, a cover 13 and entrances 12, is to be produced at one or more points in layer system 3 on substrate 1. Although the method according to the invention would very probably be suitable for positioning optical system 4 relative to substrate 1 at a first position to produce one such three-dimensional structure there, in order thereafter to carry out a plurality of further relative movements to a plurality of further positions to produce further three-dimensional structures, much more can be brought about with it.

Especially when the three-dimensional structures to be produced are larger than the exposure grid of DMD 7 itself, the three-dimensional structures have to be exposed during the relative movement between optical system 4 and substrate 1 by continuous programming of the mirrors of the DMD during the relative movement. The use of a photon source 5 and layer system 3 should be considered especially from the standpoint of such a continuous relative movement and a continuous switching process of the mirrors of DMD 7.

An alternative method according to the invention, which is based on a mask technology, is described in the following.

FIGS. 1a to 1b can also be used for the second method according to the invention and will not be represented again.

Figure 2A:
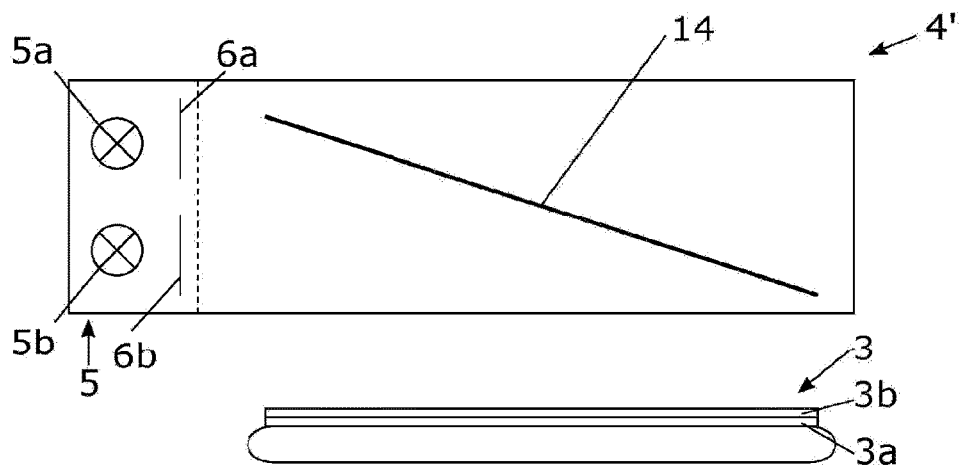
FIG. 2a shows a third and fourth process step of a second method according to the invention.

FIG. 2a shows a third and fourth process step of a second method according to the invention, wherein a substrate 1 with a coating 3 is loaded into a mask exposure unit. The mask exposure unit again comprises an optical system 4', which is designed for a surface exposure. In particular, optical elements such as a mirror, preferably a cold mirror 14, can be provided, which reflect the photons in the direction of substrate 1. The device comprises a photon source 5 with at least two single photon sources 5a, 5b, as well as filters 6a, 6b. Information concerning single photon sources 5a, 5b and filters 6a, 6b from the previous text sections applies analogously.

Figure 2B:
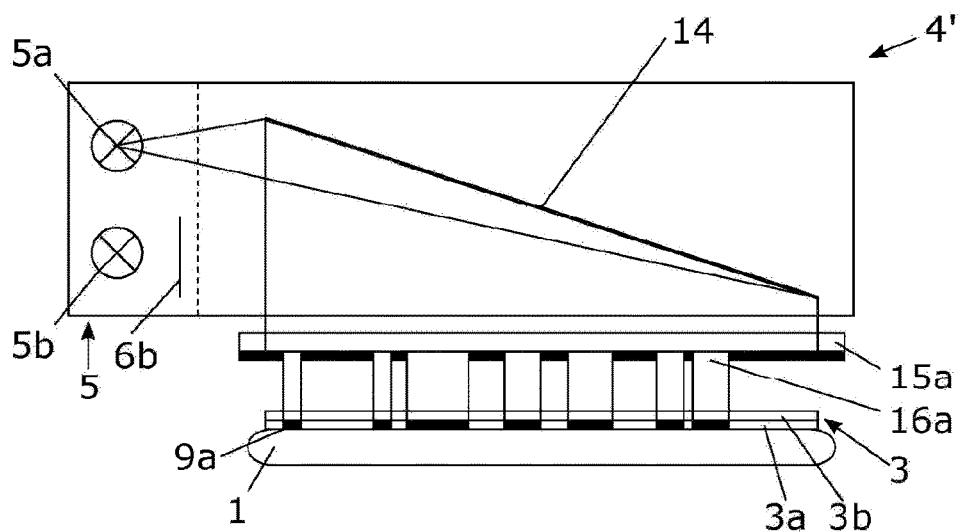
FIG. 2b shows a fifth process step of the second method according to the invention.

FIG. 2b shows a fifth process step of the second method according to the invention, wherein a first mask 15a with first apertures 16a is inserted between optical system 4' and substrate 1. First mask 15a is aligned in particular relative to substrate 1, preferably by means of alignment marks (not shown). Filter 6a (not shown) is opened or removed or else second filter 6b is closed. Photons with a first wavelength thus exit from first single photon source 5a and are projected through apertures 16a of first mask 15a onto coating 3. Since only first photosensitive layer 3a of layer system 3 is sensitive for the photons of the first wavelength of first single photon source 5a, the chemical and/or physical reactions take place only in first exposed depth regions 9a, although the photons also penetrate second photosensitive layer 3b.

Figure 2C:
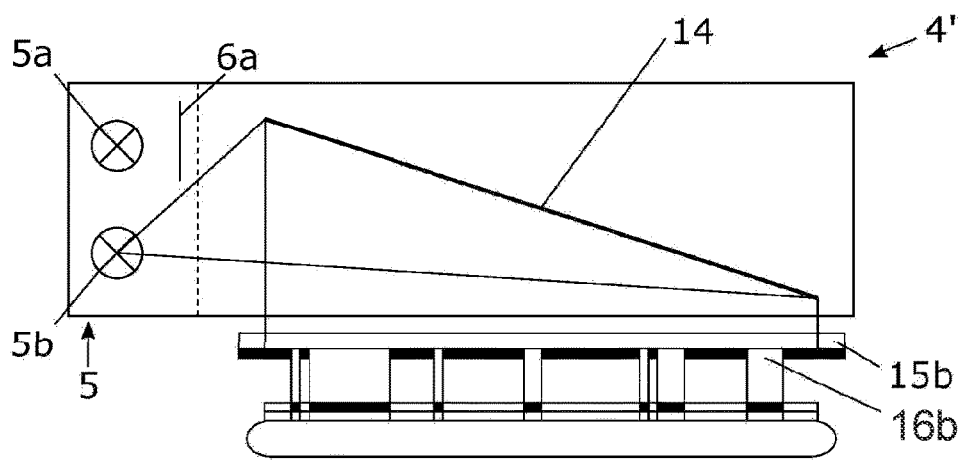
FIG. 2c shows a sixth, seventh and eighth process step of the second method according to the invention.

FIG. 2c shows a sixth, seventh and eighth process step of a second method according to the invention, wherein first mask 15a (not shown) is first exchanged for second mask 15b. Second mask 15b comprises second apertures 16b. Second mask 15b is aligned in particular relative to substrate 1, preferably by means of alignment marks (not shown).

According to the invention, filter 6b (not shown) is kept opened or removed or else second filter 6a is kept closed. Photons with a second wavelength thus exit from second single photon source 5b and are projected through apertures 16b of second mask 15b onto coating 3. Since only second photosensitive layer 3b of layer system 3 is sensitive for the photons of the second wavelength of second single photon source 5b, the chemical and/or physical reactions also take place only in second exposed depth regions 9b, although the photons also reach first photosensitive layer 3a.

Following these process steps, further process steps, in particular the development of coating system 3, take place. Advantageously, only a single development step is required.

LIST OF REFERENCE NUMBERS

1 Substrate
2 Coating system
2a, 2b Single coating element
3 Coating
3a, 3b Areas/photosensitive layers
4, 4' Optical system
5 Radiation device, photon source
5a, 5b Single photon sources
6a, 6b Filters
7 Digital micromirror unit, digital micromirror device (DMD)
8a, 8b Secondary beams
9a, 9b Exposed depth region
10a, 10b Layout section
11 Cavity
12 Cover
13 Entrances
14 Mirror
15a, 15b Masks
16a, 16b Apertures

What is claimed is:

1. A method for exposure of a photosensitive coating, the photosensitive coating including at least a first photosensitive area and a second photosensitive area, the method comprising in the following sequence:
    exposing the photosensitive coating to photons of a first wavelength during which the first photosensitive area of the coating reacts to the photons of the first wavelength, and
    exposing the photosensitive coating to photons of a second wavelength during which the second photosensitive area of the coating reacts to the photons of the second wavelength,
    wherein the first wavelength is different from the second wavelength,
    wherein the photosensitive coating is exposed by means of a dynamically controllable unit, and
    wherein the first photosensitive area and the second photosensitive area are within a depth of field of a projection of the dynamically controllable unit.

2. The method according to claim 1, wherein the photosensitive coating is exposed by means of at least one mask.

3. The method according to claim 1, wherein the exposing of the photosensitive coating to the photons of the first wavelength produces a photochemical reaction only in the first area and the exposure of the photosensitive coating to the photons of the second wavelength produces a photochemical reaction only in the second area.

4. The method according to claim 1, wherein the photosensitive coating is exposed in a spatially resolved and/or punctual manner.

5. The method according to claim 4, wherein the photosensitive coating is exposed by means of beam bundles.

6. The method according to claim 1, wherein the exposing of the photosensitive coating to the photons of the first wavelength and the exposing of the photosensitive coating to the photons of the second wavelength is by an individually controllable photon source such that a wavelength and/or a dose of the photons is/are adjusted.

7. The method according to claim 1, wherein the exposing of the photosensitive coating to the photons of the first wavelength and the exposing of the photosensitive coating to the photons of the second wavelength is by positioning a filter in front of a broad-band photon source such that a wavelength and/or a dose of the pholons is/are adjusted.

8. The method according to claim 1, wherein different depth regions of the photosensitive coating react after one another.

9. The method according to claim 1, wherein the photosensitive coating has sensitivities for photons of the same wavelength which vary over a thickness of the photosensitive coating.

10. The method according to claim 1, wherein the first photosensitive area is a first layer, and
    wherein the second photosensitive area is a second layer on the first layer.

11. An article produced with the method of claim 1.

12. The method according to claim 1, wherein the dynamically controllable unit is a digital micromirror unit.

13. A device for the exposure of a photosensitive coating, the photosensitive coating including at least a first photosensitive area and a second photosensitive area, the device comprising:
    a radiation device configured to:
        expose the photosensitive coating to photons of a first wavelength during which the first photosensitive area of the photosensitive coating reacts to the photons of the first wavelength; and
        expose the photosensitive coating to photons of a second wavelength during which the second photosensitive area of the photosensitive coating reacts to the photons of the second wavelength; and
    a dynamically controllable unit configured to expose the photosensitive coating to the pholons of the first and second wavelengths,
    wherein the first wavelength is different from the second wavelength, and
    wherein the first photosensitive area and the second photosensitive area are within a depth of field of a projection of the dynamically controllable unit.

14. The device according to claim 13, comprising at least one mask configured to expose the photosensitive coating to the photons of the first and second wavelengths.

15. The device according to claim 13, comprising a mobile support configured to move the photosensitive coating with respect to the radiation device.

16. The device according to claim 13, wherein the dynamically controllable unit is a digital micromirror unit.

17. An article produced with the device of claim 13.

* * * * *